United States Patent [19]

Nicolaidis

[11] Patent Number: 5,586,124
[45] Date of Patent: Dec. 17, 1996

[54] STRONGLY FAIL-SAFE INTERFACE BASED ON CONCURRENT CHECKING

[75] Inventor: Michael Nicolaidis, Athens, Greece

[73] Assignee: Sofia Koloni, Ltd., Athens, Greece

[21] Appl. No.: 428,228

[22] PCT Filed: Sep. 2, 1994

[86] PCT No.: PCT/GR94/00021

§ 371 Date: May 1, 1995

§ 102(e) Date: May 1, 1995

[87] PCT Pub. No.: WO95/06908

PCT Pub. Date: Mar. 9, 1995

[30]   Foreign Application Priority Data

Sep. 2, 1993 [GR]   Greece .................... 930100359

[51] Int. Cl.$^6$ ..................................... G06F 11/10
[52] U.S. Cl. ........................ 371/25.1; 371/22.6; 371/72
[58] Field of Search ................... 371/25.1, 27, 22.6, 371/72, 68.1

[56]   References Cited

U.S. PATENT DOCUMENTS 3,781,796  12/1973  Smith .
4,739,505   4/1988  Leslie ......................................... 371/37
5,404,497   4/1995  Noraz et al. ............................. 395/575

FOREIGN PATENT DOCUMENTS 0385885   9/1990   European Pat. Off. .

OTHER PUBLICATIONS

"A Generalized Theory of Fail–Safe Systems", by M. Nicolaidis et al, Digest Of Papers Of The 19th International Symposium On Fault–Tolerant Computing, FTCS–19, Jun. 20, 1989, Chicago, U.S., pp. 398–406, XP89502.

"On Error Indication for Totally Self–Checking Systems" by Takashi Nanya and Toshiaki Kawamura, IEEE Transactions on Computers, vol. C–36, No. 11, Nov. 1987.

"A Totally Self–Checking Generalized Prediction Checker And Its Use For Built–In Testing" by Eiji Fujiwara and Kohji Matsuoka, Musashino Electrical Communication Laboratory, N.T.T., Musashino–Shi, Tokyo 180, Japan, 0731–3071/85/0000/0384 1985 IEEE.

"Design of Dynamically Checked Computers" IFIP Congress, Edinburgh, 1968, Inf. Processing 68, Amsterdam, North Holland 1969, V. 2, pp. 878–883 (Unavailable at this time, will be provided in Supplemental Information Disclosure Statement).

Primary Examiner—Vincent P. Canney
Attorney, Agent, or Firm—Lowe, Price, LeBlanc & Becker

[57]   ABSTRACT

The present invention relates to a fail-safe control interface including branches for providing signals having a safe state or a non-safe state. Each branch comprises inputs for receiving at least two binary control signals (Si, Si*); a source of a non-safe state (Fe) connectable through a basic chain of elements (14, 15) to an output (Oi) when the control signals realize a predetermined combination; a concurrent checker (17) providing an error detection signal (g1, g2) if the inputs of a pair of its inputs are at predetermined states; and means (14*) for providing a first input of said pair of inputs with a signal corresponding to the state of said output and the second input of said pair of inputs with a signal corresponding to the output of a duplicate chain of the basic chain, this duplicate chain reacting like the basic chain in response to the control signals.

9 Claims, 8 Drawing Sheets

STRONGLY FAIL-SAFE INTERFACE BASED ON CONCURRENT CHECKING

The present invention concerns a fail-safe interface which is intended either to effectively control an apparatus according to the states of binary control signals provided by a processing system, or to set the apparatus in a safe state if the interface fails to control the apparatus according to the binary signals.

A circuit is said to be fail-safe with respect to a fault set, if for each fault in the fault set and for each input of the circuit, the output of the circuit is either correct or safe.

An article of In Proc. International Symposium on Fault-Tolerant Computing by M. NICOLAIDIS, S. NORAZ, B. COURTOIS, "A Generalized Theory of Fail-safe Systems", Montreal, Canada, June 1989, provides the basic theory of fail-safe systems and proposes a strongly fail-safe interface allowing a VLSI implementation.

FIG. 1 shows a circuit proposed in the above article. Since in integrated circuits both stuck-at 1 and stuck-at 0 faults may occur with non negligible probability, the standard representation of the binary values 1 and 0 by means of high and low voltage levels cannot allow to design fail-safe systems. To avoid this problem, a frequency coding can be used. The presence of a frequency within a bandwidth about a given frequency Fe represents the non safe level (say level 1) and the absence of this frequency in the bandwidth represents the safe level (say level 0). The circuit uses a switch 10 (a MOS transistor) to disconnect each output Oi from the source of the frequency Fe each time a processing system 12 generates a signal Si corresponding to the safe state. Since a stuck-on fault of switch 10 would permanently connect the output Oi to the frequency Fe (resulting in the permanent presence of the non safe state at the output), the interface would not be fail-safe. To avoid this, a second switch 10*, controlled by a duplicate processing system 12*, is connected in series with each first switch 10 so that, in case one switch fails, the second one will disconnect the output from frequency Fe each time it is required. With this configuration, the circuit is said to be "fail-safe".

The next problem is that if a first fault occurs (e.g. stuck-on fault of one switch 10) this fault remains undetectable and a second fault can occur later (e.g. a stuck-on fault of the second switch 10*). In that case the frequency Fe is connected to the output of the interface and the strongly fail-safe property is lost. To cope with this problem, a BIST (Built-In Self Test) technique is used in order to test the interface periodically so that the occurrence of the first fault is detected before new faults occur. With this fail-safe configuration, which additionally detects faults, the circuit is said to be "strongly fail-safe".

The BIST solution has the drawback that faults are only checked periodically. If two faults occur within a period, fail-safety can be lost. Therefore, the frequency of the tests must be high to reduce the probability of the occurrence of two faults in a period. This strongly perturbs the normal operation of the interface. Furthermore, BIST circuitry can be complex, since it needs a test pattern generator and an output response compactor (e.g. signature analyzer) and its faults should also be taken into account. For instance, if the BIST circuitry is erroneously permanently activated, it can produce some waveform on the outputs of the interface. If the frequency of this waveform happens to be about Fe, unsafe values would be generated and the fail-safety can be lost.

An object of the invention is to provide a strongly fail-safe interface which does not use periodic testing.

Another object of the invention is to provide an ideally fail-safe interface, which, as soon as a single fault occurs, remains in a safe state despite the occurrence of subsequent faults.

These objects are achieved, according to the invention, by providing a fail-safe circuit branch comprising inputs for receiving at least two binary control signals; a source of a non-safe state connectable through a basic chain of elements to an output when the control signals realize a predetermined combination; a concurrent checker providing an error detection signal if the inputs of a pair of its inputs are at predetermined states; means for providing a first input of said pair of inputs with a signal corresponding to the state of said output and the second input of said pair of inputs with a signal corresponding to the output of a duplicate chain of the basic chain, this duplicate chain reacting like the basic chain in response to the control signals.

An important aspect of the invention is to provide a fail-safe circuit comprising a plurality of fail-safe branches, all sharing a common concurrent checker, using a non-fail-safe combining circuit receiving the outputs of the branches. This combining circuit must be such that it lacks a source of the non-safe state and that it provides a non-safe state output if one or more branches provide the non-safe state.

The invention also provides a fail-safe control interface, comprising, in the basic chain, at least one switch controlled by one of the binary control signals and means for irreversibly cutting the power of the interface if the concurrent checker provides an error detection signal. The power is cut down safely by applying the above aspect of the invention to the error detection signal, which is not directly exploitable.

The foregoing and other objects, features, and advantages of the invention will become apparent from the following detailed description of embodiments in connection with the figures, among which:

FIG. 1, previously described, shows a conventional fail-safe interface;

The following description is related, by way of example, to the particular case where the non safe state for controlling an apparatus is a frequency signal. Those skilled in the art will be able to apply the invention to systems with other non safe states, such as a high power state (the power supply of the apparatus).

Figure 1:
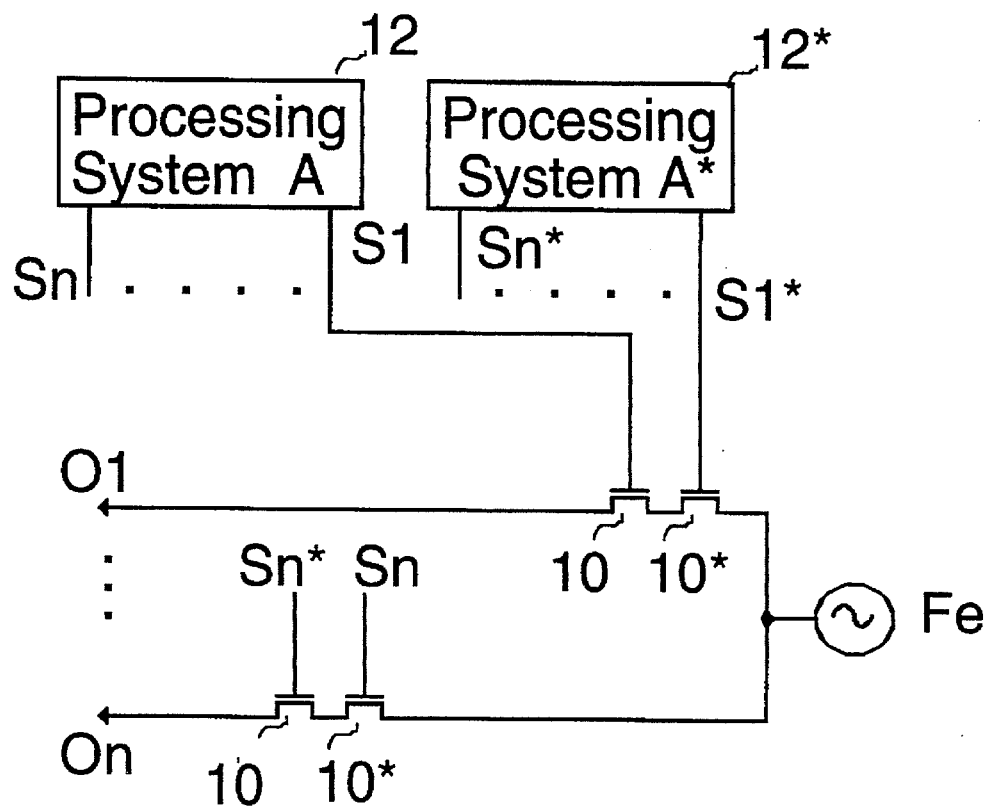
Figure 2:
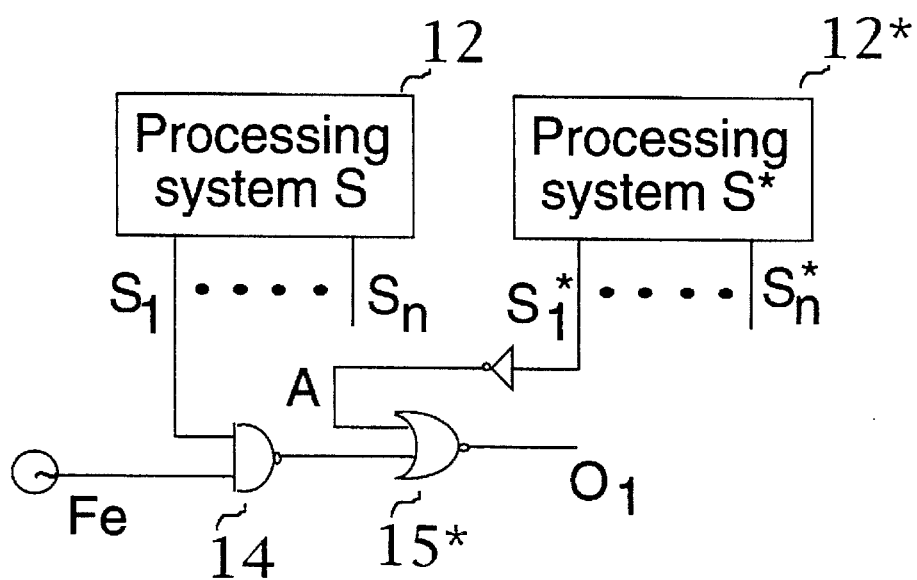
FIG. 2 illustrates a logic gate equivalent to the switches in the interface of FIG. 1.

In FIG. 2, the switches 10, 10* associated to each output Oi of FIG. 1 are replaced by an equivalent in logic gates. A gate 14 receives the frequency signal Fe and a control signal S1 from processing system 12. A gate 15 receives the output of gate 14 and, at A, the complement of a duplicate control signal S1* from processing system 12*, and provides the output O1 of the interface. These gates 14, 15 could be identical but the simultaneous occurrence of identical faults in these gates could propagate the frequency Fe (non safe state) to the output of the interface. Since identical faults in identical gates are more probable than faults of different types in non identical gates, using non identical gates will be preferable. Therefore, for example, gate 14 is a NAND gate and gate 15 is a NOR gate. Under normal (i.e. fault free) operation, the values S1=1, S1*=1 propagate the frequency Fe to the output of the interface, while the values S1=0, S1*=0 disconnect the frequency Fe from the output of the interface (safe state). It can be checked trivially that there is no single fault which can connect frequency Fe to the output of the interface when, in the fault free system, this output is intended to be in the safe state (i.e. when S1=0, S1*=1). The interface is fail-safe for single faults.

Instead of periodically testing the interface in order to ensure the strongly fail-safe property (as was proposed in the cited article of In Proc. International Symposium on Fault-Tolerant Computing), the invention adopts a solution which consists in the use of concurrent checking. A way to perform this checking is to duplicate the interface and use a comparison in order to detect the occurrence of the faults. However, for this technique to be valid, it is necessary that:

a) during the normal (i.e. fault free) operation of the system, the elements of the interface receive all the input values required for detecting any fault which would invalidate the strongly fail-safe property, and b) the effects of the faults (i.e. the errors) are propagated to observable points (i.e. to the inputs of the concurrent checker).

Condition a) is neither satisfied in FIG. 1 nor in FIG. 2. For instance, during the fault free operation in FIG. 1, it cannot be tested if transistor 10* is able to disconnect the output O1 form the frequency Fe. In fact, this testing requires to have S1=1 and S1*=0 which never occurs in the fault free operation. Similarly, during the fault free operation in FIG. 2, it cannot be tested if the NOR gate can disconnect the output O1 from frequency Fe. From a detailed analysis of FIG. 2, it can be noted that the NAND gate is exercized exhaustively during the fault free operation and thus the condition a) is satisfied for this gate. On the other hand the NOR gate does not receive all the values which allow to detect all the faults in this gate. For instance, the stuck-at 0 fault at the input A of this gate can be detected only by 1 at input A and 0 at the other input, which does not happen during the normal operation Thus, the fault is undetectable. In order to test the NOR gate, it needs to receive the input values, or vectors, (0,0), (0,1) and (1,0).

Figure 3:
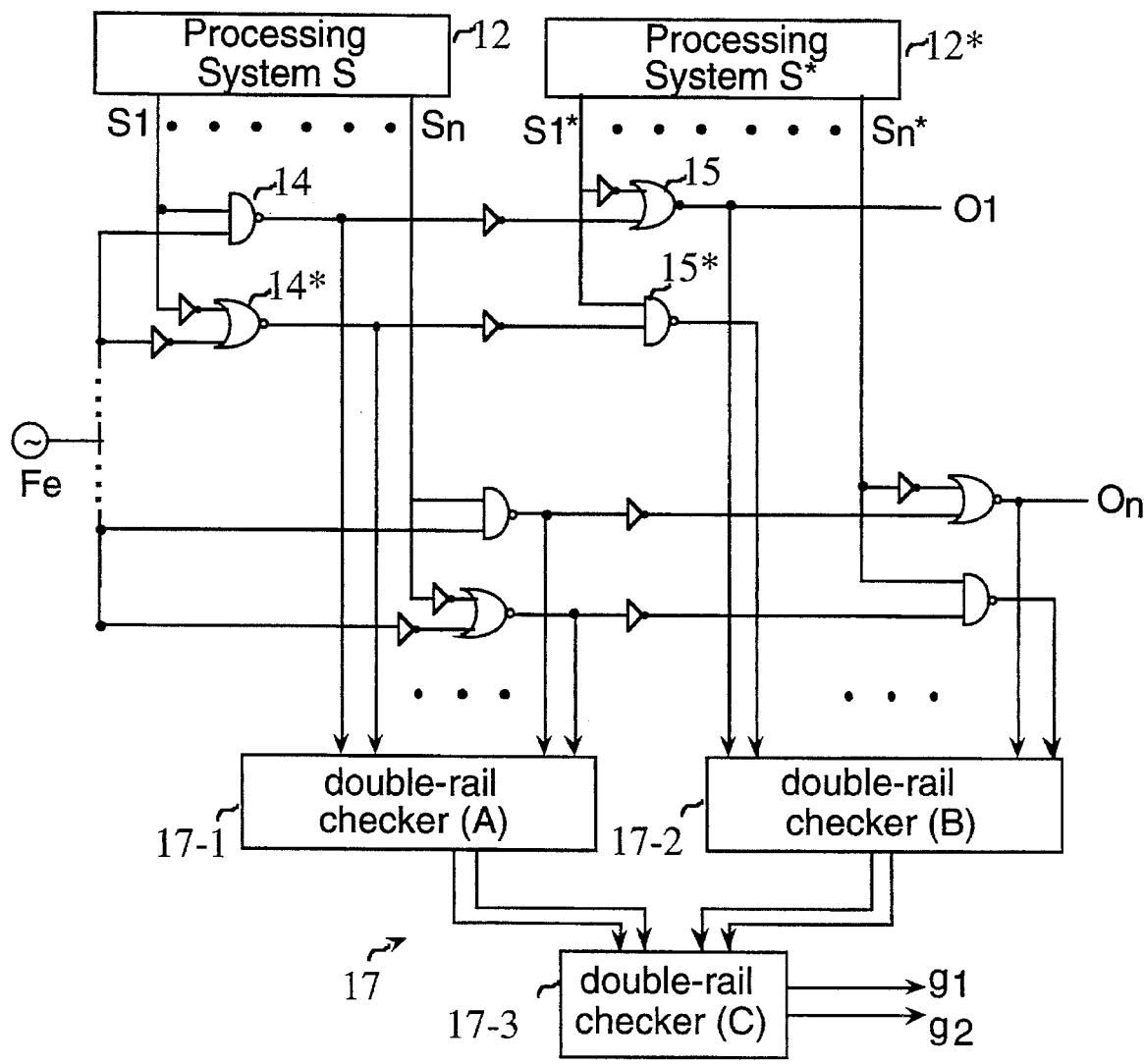
FIG. 3 shows an embodiment of a strongly fail-safe interface according to the invention.

FIG. 3 shows an embodiment of an interface according to the invention which satisfies both conditions a) and b). Condition a) is satisfied by inverting the output of the NAND gate 14. In addition, in order to satisfy condition b), gates 14 and 15 are duplicated respectively by a NOR gate 14* with inverted inputs connected to those of gate 14 and a NAND gate 15* receiving the inverted output of gate 14* and signal S1*. The outputs of gates 14, 14* and 15, 15* are checked by an embedded double-rail checker 17 as proposed in an article of IFIP Congress, Edinburgh, 1968, Inf. Processing 68. Amsterdam, North Holland, 1969. V.2, pp. 878–83, "Design of dynamically checked computers". This checker checks all the branches of the interface generating the outputs O1 to On, and delivers an error indication on two signals g1, g2 (i.e. (g1,g2)=(1,0) or (0,1) for correct operation and (0,0) or (1,1) for an error detection). It comprises two double-rail checkers 17-1, 17-2 receiving respectively the output pairs of gates 14, 14* and the output pairs of gates 15, 15*. A double-rail cell 17-3 receives the outputs of checkers 17-1 and 17-2 and provides signals g1 and g2.

The interface of FIG. 3 is fail-safe for any single fault since if the expected values of Si, Si* are 0, 0, then the output Oi is isolated from the frequency Fe at two points (gates 14 and 15), and thus, no single fault can establish the connection between Fe and the corresponding output Oi.

It will now be shown that all troublesome faults in the gates can be detected (the interface is strongly fail-safe). During the fault free operation, each NAND gate of the interface receives at least the input values (1,1), (1,0) and (0,1), and each NOR gate receives at least the input values (0,0), (0,1) and (1,0), which are the values needed for testing these gates. It is easy to check that any stuck-at fault in the interface is detectable.

Figure 4:
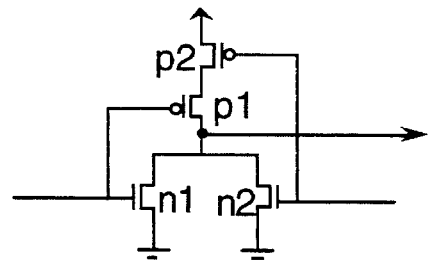
FIG. 4 shows the structure of a NOR gate.

The detection of stuck-open faults is illustrated for a NOR gate, the structure of which is shown in FIG. 4. A NOR gate comprises two NMOS transistors n1 and n2 connected in parallel between a supply voltage through two series connected PMOS transistors p1 and p2 and ground. The gates of transistors n1 and p1 constitute a first input, and those of transistors n2 and p2 a second input. The output is taken between transistors p1 and n1.

Consider a stuck-open fault of transistor n1. The input (0,0) sets the output to 1 and the input (1,0) (1 on transistor n1 and 0 on transistor n2) detects the fault. For transistor n2, the inputs (0,0) and (0,1) detect the fault.

For transistors p1 and p2, the inputs (0,1) (or 1,0) and (0,0) detect the fault. All these couples of inputs are applied during the fault free operation.

It is well known that stuck-on faults in static CMOS gates may produce undetermined erroneous levels on the gate output. The interpretation of such values by the subsequent logic (in the present case by the double-rail checker) is unpredictable. In this case the detection of stuck-on faults cannot be guaranteed. However, the resistance of the conduction state of a n-transistor is significantly lower than the resistance of two p-transistors connected in series. Thus, if both the n and the p networks of the gate are conducting, the NOR gate output is at the logical value 0 (this behaviour will be said n-dominant).

If transistor n1 or n2 is stuck-on, the fault is detected by the input (0,0).

Since the NOR gate is n-dominant the stuck-on faults of the p transistors do not modify the gate function and they are undetectable. Since the function of the NOR gate is not modified and the NAND gate is assumed fault-free, the interface remains fail-safe. Furthermore, if after the p-transistor stuck-on fault another detectable fault (i.e. stuck-at, stuck-open, or stuck-on of an n-transistor) occurs in the NOR gate, the resulting multiple fault is detectable. On the other hand, if the stuck-on fault of one p transistor of the NOR gate is followed by the stuck-on fault of the second p-transistor, the resulting fault is undetectable but the interface remains fail-safe (as for the single p-transistor stuck-on fault), and if a new detectable fault occurs in the NOR gate the resulting multiple fault is detectable.

Similar situations occur in the NAND gates which are inherently p-dominant.

Also, it can be verified that similar situations occur by considering sequences of faults affecting the whole interface of FIG. 3 (i.e. the NAND gates, the NOR gates and the inverters). Therefore, the interface is strongly fail-safe.

In FIG. 3, the fail-safe output Oi has been generated by a chain of gates which consists of a NAND gate, an inverter and a NOR gate connected in series. Other possible equivalent chains will appear to those skilled in the art. For example, the series connection of two NAND gates.

If a fault occurs in the embedded double-rail checker 17 and remains undetectable, then, the checker can loose its ability to detect the occurrence of an erroneous. Thus if a fault occurs later in the interface, it can remain undetectable. This way the strongly fail-safe property can be lost. Therefore faults in checker 17 must be detected.

Fortunately, a double-rail checker satisfies the self-testing property (see the above cited IFIP Congress). However, in some systems, the input codes applied to an embedded double-rail checker may not be sufficient to test it. In the present case (FIG. 3), the double-rail checkers 17-1 and 17-2 receive all the possible input codes and the fault detection is ensured, but the double-rail checker cell 17-3 receives only two input codes (due to the dependency between the values of the signals Si and Si*), and some faults in this cell are undetectable.

An article of The 15th International Symposium on Fault-Tolerant Computing, Ann Arbor, USA June 1985, "A totally self-checking generalized prediction checker and its application for Built-in Testing", describes a double-rail checker which avoids this problem.

The system of FIG. 3 does not check the faults in the processing systems 12 and 12*. Even without such a checking, the fail-safe property is ensured for faults in one of the processing systems (but not the strongly fail-safe property). Fault detection in the processing systems can be used to initiate a maintenance step (replacing of the faulty system) and/or to lock the system in the safe state, so that the occurrence of a subsequent fault does not destroy the fail-safe property of the whole system. In order to check the processing systems, their outputs Si and Si* must be synchronized. In that case, the systems can be checked by using a double-rail checker to compare the signals Si against the signals Si*.

Figure 5:
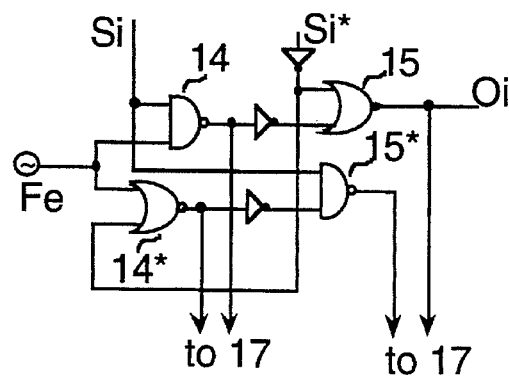
FIG. 5 shows a modification of the connections of elements of FIG. 3 enabling the testing of processor systems providing the control signals to the interface.

FIG. 5 shows a modification of the connections of the gates of FIG. 3, which avoids the use of this additional checker. The input of gate 14* that was connected to signal Si receives the inverse of signal Si*, and the input of gate 15* that was connected to signal Si* receives signal Si. It can be verified that, with this arrangement, the whole system comprising the processing systems 12, 12* and the interface, is strongly fail-safe.

The interface obtained up to now through the previously described steps is strongly fail-safe, i.e. if a single fault occurs, it will either deliver a signal which is still correct or a signal at the safe state, and this fault is reliably detected. The fault detection is provided by the combination of two signals g1 and g2. It would be particularly useful to exploit the fault detection to irreversibly set the interface in its safe state, for example by cutting its power supply. The interface will then always remain in its safe state, whatever subsequent faults may occur. The interface would then be ideally safe. A problem resides, however, in how to exploit the two detection signals. A single line detection signal would be immediately exploitable. The single line signal is obviously an exclusive OR (XOR) between signals g1 and g2, but the simple use of an XOR gate would introduce new failure possibilities. The XOR gate would have to be tested but, as it would not receive all the necessary input vectors, it would have to be tested periodically with a test vector generator and a signature analyzer (as suggested in the above cited article of In Proc. International Symposium on Fault-Tolerant Computing). This is contrary to the object of the invention.

It has been found, according to an important aspect of the invention, that if a circuit should combine the outputs of several strongly fail-safe branches, the combining circuit need not be strongly fail-safe for its output to be strongly fail-safe, assuming that the combining circuit cannot provide the non-safe state unless one of the branches provides it (it does not have a source of the non-safe state), and that the correct output of the combining circuit is the non-safe state if one or more branches provide the non-safe state. This result is very general and holds, regardless of the nature of the combining circuit provided that the non-safe state is a state that cannot be generated by the fault-free or the defect combining circuit unless this state is provided by at least one of the input terminals of the combining circuit. Such a state is for instance a frequency range as considered previously, or a high power state (due to the energy conservation law this state cannot be generated on the output of the combining circuit if no input terminal of this circuit provides this power). Thus, the combining circuit can be of any nature (logic circuit, analog circuit, etc.).

regardless of the nature of the branches, provided that these branches are strongly fail-safe.

Since the branches are strongly fail-safe, until the first occurrence of a fault detection, each time the output of one or more of these branches is at the non-safe state, this state is correct and, according to the above assumptions, the correct output of the combining circuit is thus the non-safe state. If the combining circuit were defect, the only consequence would be that its output is either non-safe, thus correct, or incorrect but safe. If the outputs of all the branches are at the safe state, no fault in the combining circuit can set its output at the non-safe state, since this state is not provided to the circuit. Therefore until the first occurrence of a fault detection, the output of the combining circuit is either correct or safe.

This aspect is very important since it allows to implement complex strongly fail-safe functions by using some simpler strongly fail-safe functions and some combining circuit which does not require any particular property. In particular, it will allow to simply realize a strongly fail-safe XOR function, needed for exploiting the above fault detection signals g1 and g2. More generally, it will allow strongly fail-safe realizations of functions which, during normal operation, do not receive all the input vectors required for testing them. According to the invention, all the undetectable faults are concentrated in the combining circuit and need not be taken into account.

Figure 6:
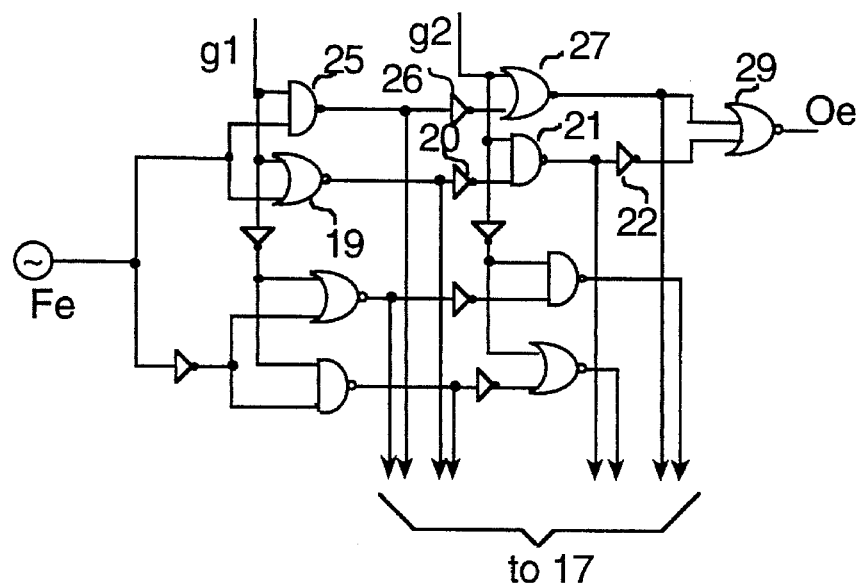
FIG. 6 shows an embodiment of a strongly fail-safe double-rail to single line error indication translator.

FIG. 6 shows an embodiment according to the invention of a circuit realizing a strongly fail-safe XOR function without periodic testing. It is in particular intended to translate a double-rail error indication g1, g2 into a single line error indication Oe. To ensure the fail-safe property, signal Oe is of the type having a safe state and a non-safe state (in this example the absence or presence of frequency Fe).

During normal operation, an XOR gate connected to outputs g1 and g2 would only receive input values (0,1) and (1,0) which are not enough to test it. To cope with this problem, in FIG. 6, the XOR function is split into two branches, having each a basic chain of gates to propagate frequency Fe and a duplicate chain. Each of these branches is similar to the ones used in FIG. 3, signals g1 and g2 playing the roles of signals S and S*. One basic chain, comprising consecutively a NOR gate 19, an inverter 20, a NAND gate 21, and an inverter 22, is such that it propagates the frequency Fe for (g1,g2)=(0,1). The other, comprising a NAND gate 25, an inverter 26, and a NOR gate 27, is such that it propagates this frequency for (g1,g2)=(1,0). Each of these branches is fully exercised with the values of signals g1 and g2 occurring during normal operation. The outputs of the two branches are combined in a NOR gate 29 which generates the error signal Oe. This NOR gate constitutes the combining circuit which does not need to satisfy any particular property.

In this example the duplicate chains comprise the same gates as the basic chains, except that their types (NOR, NAND) are swapped and that they receive the complements of signals g1, g2, and Fe. The output pairs, constituted by the outputs of the gates of the basic chains and of the outputs of the corresponding gates of the duplicate chains are provided to the double-rail checker 17 of FIG. 3. This has the advantage of fully exercising this double-rail checker, in particular the cell 17-3, so that the particular checker design described in the above cited article of The 15th International Symposium on Fault-Tolerant Computing is not needed.

When signals g1, g2 indicate an error (i.e. they take the values (0,0) or (1,1)), both inputs of gate 29 are disconnected from frequency Fe and consequently signal Oe is disconnected from frequency Fe. However, signals g1, g2 can, in some situations, oscillate between (0,0) and (1,1). Then, due to signal delays, the output Oe could, instead of staying steady (error indication), oscillate too. If the output Oe happens to oscillate at a frequency near Fe, no error is indicated. Furthermore, if a fault happens briefly, even if it happens periodically, the error indication signal Oe might not stay inactive (absence of frequency Fe) long enough to allow its exploitation (cut off the power). Therefore, it would be preferable to lock the error indication the first time it occurs. This should of course be done in a strongly fail-safe manner.

The locking of the error indication can be achieved at the level of signals g1 and g2. An article of IEEE Transactions on Computers, Vol. C-36, No 1, pp. 1389–1392, November 1987, "On error indication for totally self-checking systems", describes a synchronous error indicator lock using two XOR gates and four D latches. This error indicator lock can be used at the output g1, g2 of the double-rail checker 17.

Figure 7:
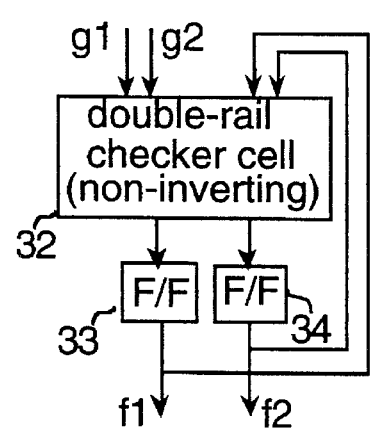
FIG. 7 shows an embodiment of an error indicator lock.
Figure 8A:
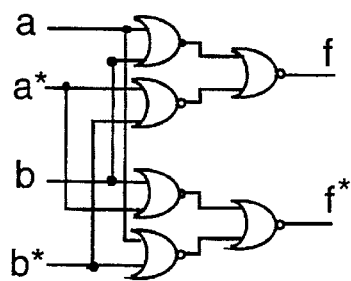
FIGS. 8a and 8b show various alternatives of a double-rail checker cell.
Figure 8B:
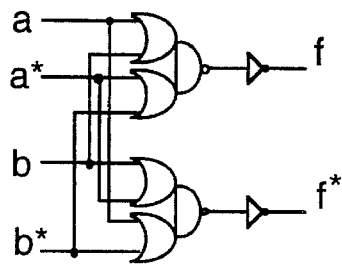

FIG. 7 shows an example of another error indicator lock. It comprises a double-rail checker cell 32 receiving signals g1 and g2 on one pair of inputs and, on a second pair of inputs, its own outputs f1, f2 through respective latches 33, 34. The double-rail checker cell used here should be non-inverting (there is an even number of inversions in any path between the inputs and the outputs of the cell). Two examples of such double-rail checker cells are shown in FIG. 8.

As soon as an error indication appears at the inputs g1, g2 (0,0 or 1,1), the outputs f1, f2 take one of the error indication states 0,0 or 1,1 and remain in these states whatever the new values applied to the inputs g1, g2. That is the error indication is memorized. The error indication is propagated from inputs g1, g2 to outputs f1, f2 and is reinjected at the inputs of the cell, then, it is again propagated to outputs f1, f2 (whatever the values of inputs g1, g2), and so on.

Figure 9:
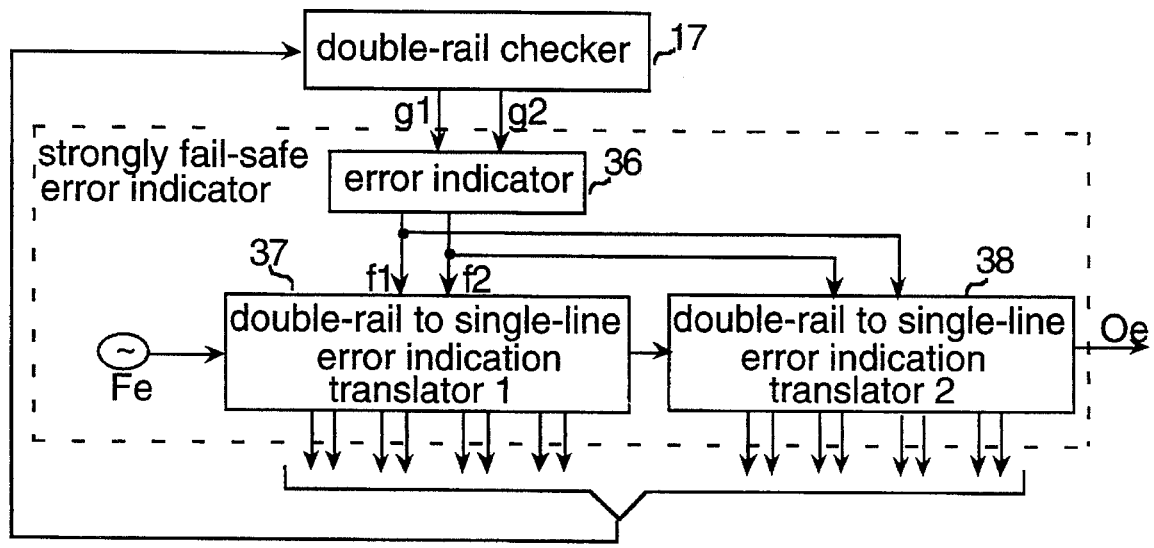
FIG. 9 shows an embodiment of a strongly fail-safe single line error indicator combining the circuits of FIGS. 6 to 8.

FIG. 9 shows an application to the interface of FIG. 3 of the error indicator lock of FIG. 7 and of the double-rail to single line translator of FIG. 6. The output g1, g2 of the double-rail checker 17 is provided to the error indicator lock 36. Two double-rail to single line translators 37, 38 are connected in series, i.e. the branches of translator 37 are connected to the frequency Fe, and those of translator 38 are connected to the output of translator 37. Both translators receive the outputs f1, f2 of the error indicator lock 36. All the checking (of the branches of the interface and of the translators) is carried out by the same double-rail checker 17. If only one translator were used, a fault in this translator could allow the propagation of frequency Fe (indicating no error) when signals f1, f2 indicate an error (signals f1, f2 indicate the fault in the translator but this fault causes the translator to indicate no fault). Using a second series connected translator overcomes this.

Figure 10:
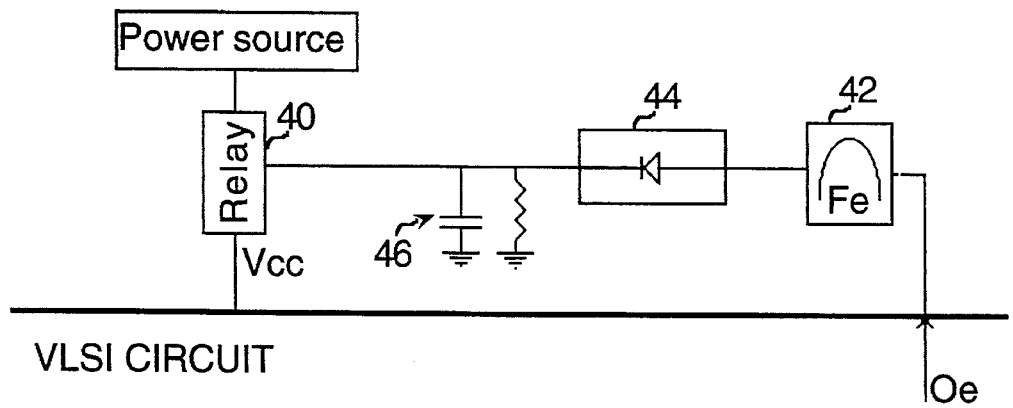
FIG. 10 shows a power cut circuit exploiting the indicator of FIG. 9.

FIG. 10 shows an example of a power-cut circuit exploiting signal Oe. This circuit is similar to one used in the above cited article of In Proc. International Symposium on Fault-Tolerant Computing. It comprises a relay 40 providing the power to the interface. This relay is controlled by signal Oe through a band-pass filter 42, a rectifier 44, and a filter 46. If signal Oe is inactive (no error), the rectified frequency Fe attains the relay, which is thus maintained conductive. If an error occurs, signal Oe is stationary and insufficient current passes the band-pass filter to power the relay. The power of the interface is cut, the frequency Fe can no longer be generated whatever are the subsequent faults that could later occur in the circuit, and the interface is thus irreversibly set in the safe state.

The power-cut circuit uses discrete components which have a very low probability to fail, especially the relay. Such components are available commercially. The resulting circuit is fail-safe under all single and multiple faults of these components that have non negligible occurrence probability.

Since, in an interface as described up to now, the power is cut reliably as soon as a single fault occurs, it is not necessary to provide redundant switches in the branches. For example, in the interface of FIG. 5, gates 15 and 15* can be omitted. The double-rail checker 17-2 is no longer needed either. This simplification is particularly well adapted to the case where high power signals are used as non-safe signals instead of frequency signals, because the switches (14, 15) that would have to transfer the high power signals are expensive.

The interface presented previously is strongly fail-safe for single faults. This supposes that faults occur one at a time. If multiple faults occur simultaneously then the fail-safety can be lost. In order to increase the safety for multiple faults, more than two gates can be connected in series for realizing the basic chain and eventually the redundant chain. Thus the frequency Fe is cut at more than two points and the number of simultaneous faults required for erroneous propagation of the frequency is increased. Another alternative consists in using two or more interfaces in series.

Figure 11:
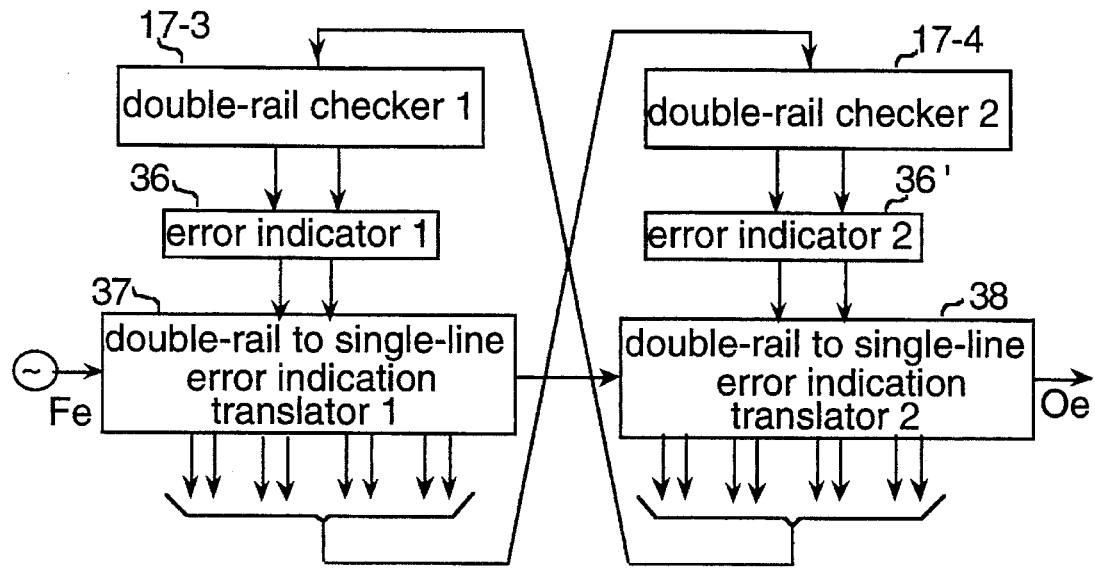
FIG. 11 shows an embodiment of a strongly fail-safe single line error indicator of improved safety.
Figure 12:
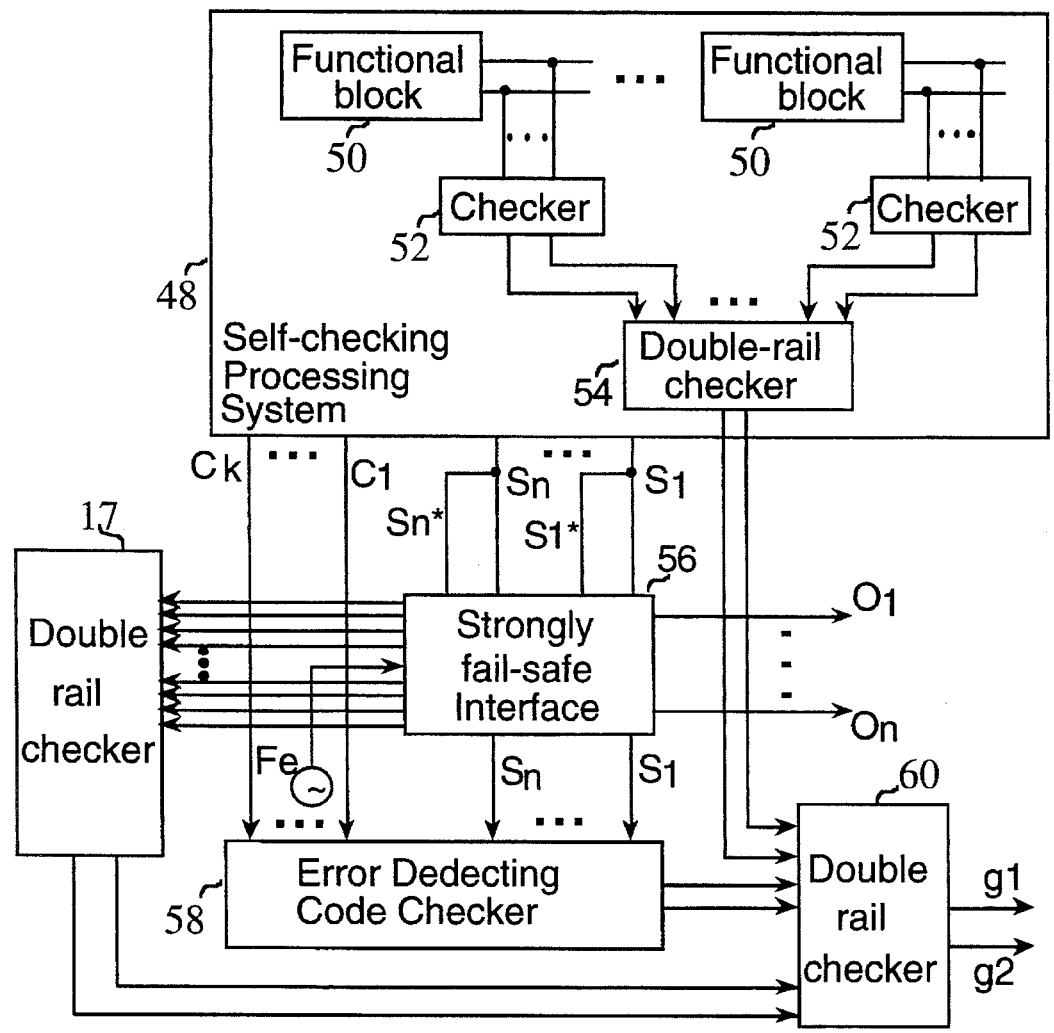
FIG. 12 shows an application of the invention to a self-checking processing system.

However, if the system using two gates in series is combined with the power cut mechanism, it provides a high protection against multiple faults (even if multiple faults occur, the probability of delivering an erroneous non-safe signal is low). FIG. 11 shows an embodiment of an error indicator providing an improved protection. This circuit is similar to that of FIG. 9, except that it has two double-rail checkers (which are in fact those, 17-1, 17-2, of the embedded double-rail checker 17 of FIG. 3) and two corresponding error indicator locks 36, 36' and translators 37, 38. One can easily verify that if the interface of FIG. 3 is combined with the strongly fail-safe error indicator of FIG. 11, the minimum number of simultaneous faults than can make the system lose the fail-safe property, is four.

The strongly fail-safe interface proposed previously for duplicated processing systems can be adapted easily to the case of self-checking processing systems based on error detecting codes. Such a system 48 is composed of several self-checking blocks 50. Each of these blocks has its own concurrent checker 52 which delivers a double-rail coded error indication. These error indications are compacted to a single error indication by means of a double-rail checker 54. The outputs S1 to Sn of the self-checking system are encoded in an error detecting code with check bits C1 to Ck. The necessary duplicate signals S1* to Sn* are derived from signals S1 to Sn. The strongly fail-safe interface 56 described previously for duplicated systems can then be used in conjunction with its double-rail checker 17. An error detecting code checker 58 is used to check the code delivered by signals S1 to Sk and their check bits C1 to Ck. This checker 58 detects the errors on the outputs of the processing system. The error indication signals g1, g2 are provided by a double-rail checker 60 which gathers the outputs of checkers 54, 58 and 17, and are injected into the strongly-fail-safe error indicator of FIG. 9 or 11. A similar arrangement can be used if the self-checking processing system is based on software coding.

Triple redundancy is often used in order to realize fault tolerant systems. In that case a voter determines the majority state of the delivered signals. This implementation results in a system which tolerates faults affecting one of three processing systems.

The aforementioned aspect of the invention, which allows to realize a strongly fail-safe circuit using non-fail-safe combining circuit, allows to simply realize a strongly fail-safe voter, which can moreover be implemented in VLSI technology.

Figure 13:
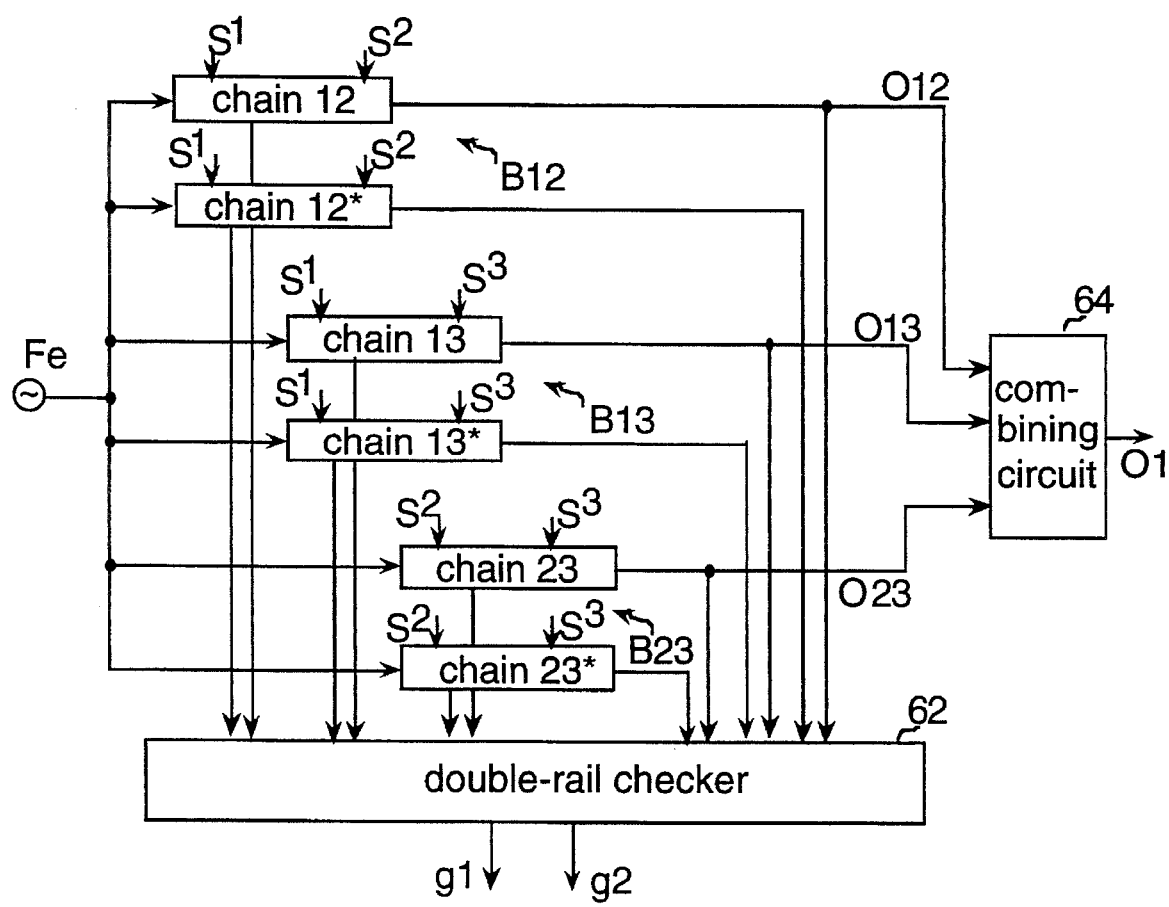
FIG. 13 shows an application of the invention to realize a strongly fail-safe voter.

FIG. 13 shows an embodiment of a voter realized according to this aspect of the invention. The inputs of the voter are the respective control signals $S^1$ to $S^3$ of three redundant processing systems. Each processing system can deliver more than one control signal S, but, for simplicity, the voter is only described for one signal, the other signals being treated identically. It is assumed that the value 0 of each input of the voter corresponds to the safe state.

If two or three of the control signals $S^1$, $S^2$, $S^3$ are equal to 1, the output O1 of the voter is connected to the source of frequency Fe (non-safe state). In any other case the output O1 is disconnected from frequency Fe. The voter comprises three branches comprising each a basic chain and a duplicate chain, as in FIG. 3, receiving the same signals. A first branch B12 receives signals $S^1$ and $S^2$, a second branch B13 receives signals $S^1$ and $S^3$, and the third branch B23 receives signals $S^2$ and $S^3$. Each branch transfers frequency Fe only if both the corresponding signals S are at 1. Branches B12, B13, and B23 have respective outputs O12, O13, and O23. The three branches are checked by a double-rail checker. Similarly to the branches of the of FIG. 3, the output g1, g2 of the double-rail checker 62 feeds the inputs of the error indicator of FIG. 9 or 11.

In addition, a logic circuit 64 combines the signals O12, O23 and O13 to give a single output O1. This logic circuit is such that, if two or three of signals $S^1$, $S^2$, $S^3$ are equal to 1 and consequently if at least one of signals O12, O13, O23 provides frequency Fe, it transfers frequency Fe to output O1.

In the above voter, the detection of a fault affecting any of the three branches of the interface would cut the power of the interface. The interface is strongly fail-safe but not fault tolerant. In order to render the interface fault tolerant, it is proposed hereunder to cut only the power of the branch which includes the defect.

Figure 14:
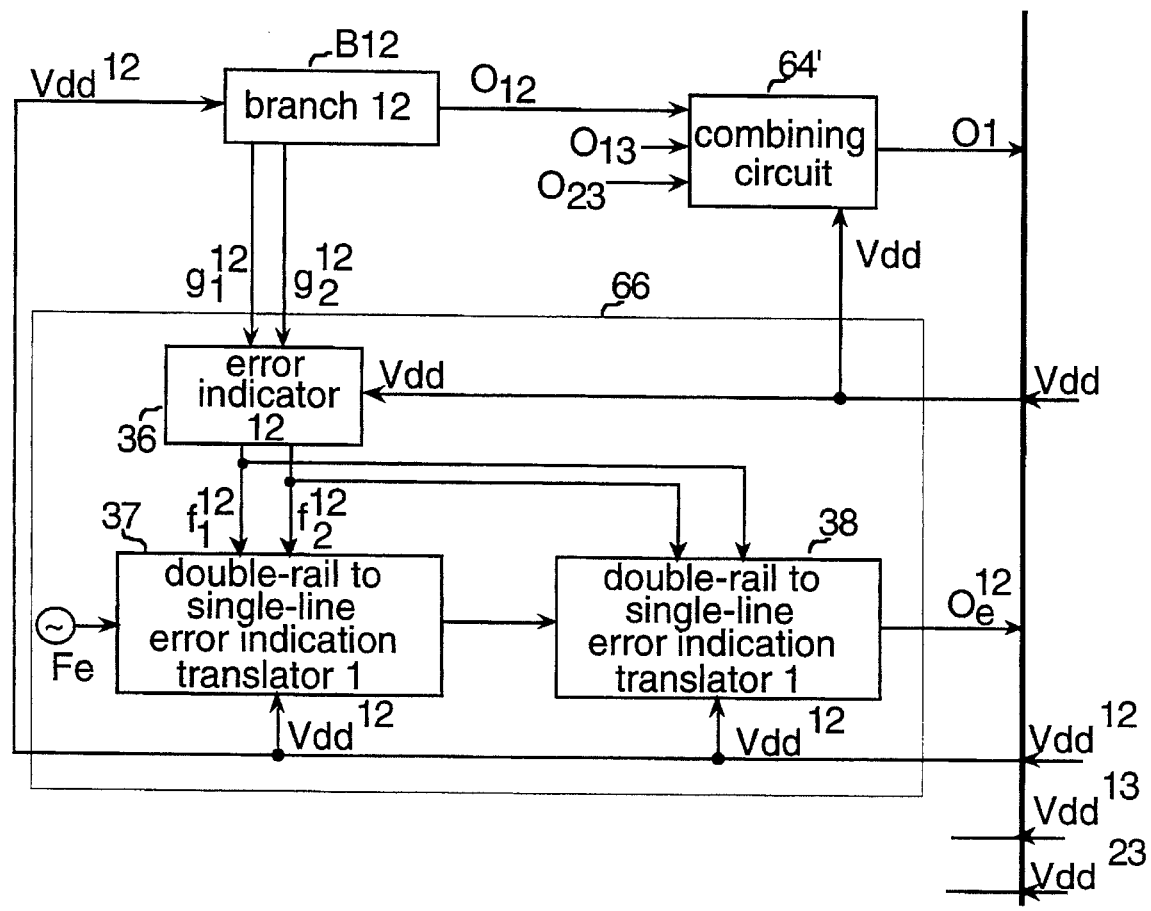
FIG. 14 shows an embodiment of a strongly fail-safe fault-tolerant interface, using a voter.

FIG. 14 shows an example of how this can be achieved, for one branch, B12. Branch B12, as the other branches B13 and B23, is associated to an error indicator 66 as that of FIG. 9, providing an error signal $Oe^{12}$. Branch B12, having only two check lines, directly provides these lines as inputs $g1^{12}$ and $g2^{12}$ to the error indicator 66 (if there were more branches associated to signals $S^1$ and $S^2$, they would be checked by a double-rail checker providing the inputs $g1^{12}$ and $g2^{12}$). A combining circuit 64' gathers the outputs of the branches B12, B13, and B23 and provides the output O1.

Each branch has a specific power supply $Vdd^{12}$, $Vdd^{13}$, and $Vdd^{23}$ which also supplies the translators 37 and 38 of the error indicator 66. Each of these specific power supplies is cut down by the corresponding signal Oe when an error is detected in the branch. The specific power supplies of the other branches however remain on, unless a fault is detected in one of these other branches. A permanent power supply Vdd supplies the error indicator lock 36 and the combining circuit 64'.

The combining circuit 64' is not identical to that of FIG. 13. This is due to the fact that, if in FIG. 13, a specific power supply is cut (for instance $Vdd^{12}$), signal O12 is not at a determined logic level, and thus, it is not always possible to generate at the output O1 the state required by the values of signals O13 and O23.

Figure 15:
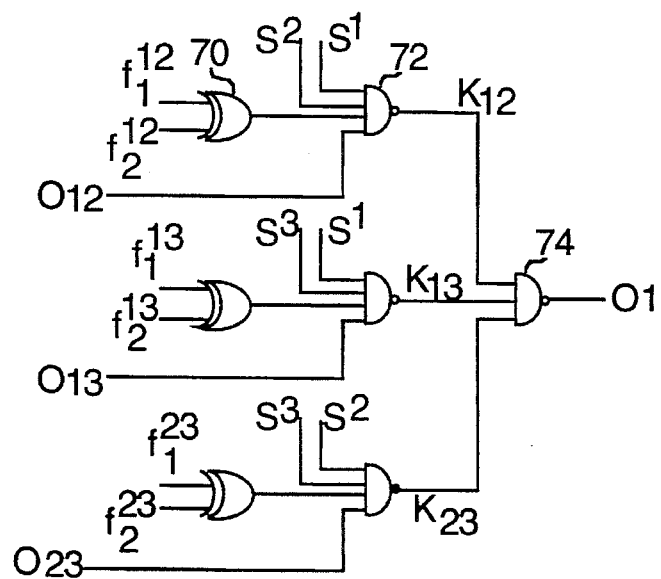
FIG. 15 shows an example of a logic combining circuit used in the voter of FIG. 14.

FIG. 15 shows an example of a logic circuit 64' avoiding this drawback. This circuit is such that it propagates the frequency Fe at the output O1 if at least one of the signals O12, O13 and O23 provides the frequency. Obviously, if all these signals are disconnected from the frequency source, output O1 is disconnected too. If one of the three signals (e.g. O12) is disconnected from the frequency source, it can be at 0 or 1, depending on which of the signals $S^1$ or $S^2$ is at 0, or even at an undetermined state in case the output $f1^{12}$, $f2^{12}$ of the error indicator lock 36 is 0,0 or 1,1 (in which case supply $Vdd^{12}$ will be cut). In order to propagate the frequency present in signals O13, O23 to output O1, regardless of the value of signal O12, signals $S^1$, $S^2$ and $f1^{12}$, $f2^{12}$ are used to transform signal O12 into a signal K12 as shown in FIG. 15. An XOR gate 70 receives signals $f1^{12}$, $f2^{12}$, and a NAND gate 72 receives signals $S^1$, $S^2$, O12, and the output of gate 70. Signals K13 and K23 are similarly obtained. Signals K12, K13 and K23 are provided to a NAND gate 74 which provides signal O1.

Finally the fail-safe voter can be modified to detect faults in the processing systems and to isolate the defect processing system. In order to do this, each branch of the interface is configured as in FIG. 5. Thus, if one of the three processing systems is defect, the checkers of the branches which are controlled by the defect processing system will detect the fault. The combining circuit will be realized as above (FIG. 15). A double-rail checker and an error memorization mechanism are used as in FIG. 14 for each branch corresponding to a couple of processing systems, in order to lock the branch in the safe state in case an error is detected.

Figure 16:
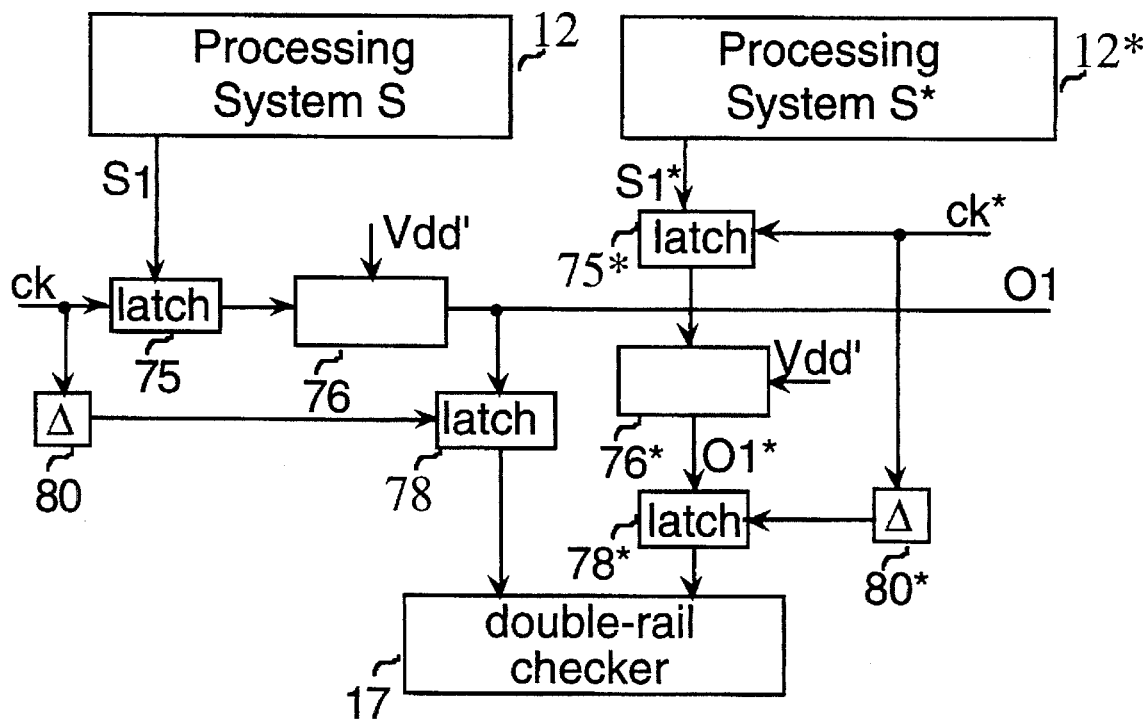
FIG. 16 shows an example of a strongly fail-safe comparator delivering high power outputs.

An example of a strongly fail-safe comparator delivering high power outputs is shown in FIG. 16. The outputs S1 and S1* of the processing systems S and S* are latched 75, 75* when the clock signals ck, ck* are active. Then, the latched signal S1 enters a circuit 76 that transforms it into a signal O1 having as non-safe state a high power state corresponding to a high value of the product Vdd'.I (Vdd' being the voltage and I the current corresponding to this state). That is: when the signal S1 has the non-safe value the high power (required for instance to drive an actuator) is generated on O1, and when S1 has the safe value O1 is connected to the ground. At the same time the signal S1' (after being latched 75*), enters a circuit 76* that transforms it into a signal O1* that brings the inverse logic values (O1* is connected to the ground for the non-safe value and to the Vdd' for the safe value). This last signal does not need to drive a high power level.

Of course, the voltage level of Vdd' is not necessary equal to 5 volts, but it can take values such as 20 volts, 30 volts, etc., according to the requirements of the actuators and the capabilities of the integrated circuits technology.

The values of O1 and O1* are loaded to some latches 78, 78* and a double-rail checker 17 is used to check the outputs of these latches (of course, this checker recognises as logic 1 the voltage level of Vdd' and as logic 0 the voltage level of the ground). The outputs of the double-rail checker are monitored by a strongly fail-safe error indicator as the one of FIGS. 9 and 11.

The latches 78, 78* used for the signals O1, O1* are required for the following reason. Since the actuators dissipate a high power, the transitions of the signal O1 may be of higher duration than the ones of the signal O1*. Thus, to avoid false alarms, the signals of O1, O1* will be latched with some adequate delay with respect to the signals S1, S1* (the clocks ck, ck* are delayed by means of two delay elements 80, 80*). This is possible since the actuators have a high response time (of the order of milliseconds) and the signals S1, S1* remain stable for a long time (long latching period).

The strongly fail-safe property is achieved since, if the state of O1 does not correspond to the state of O1*, the double-rail checker detects the error and the strongly fail-safe indicator cuts the power of the circuit (blocking the system irreversibly on the safe state). The strongly fail-safe property holds for single faults. To increase the safety, we can compare the signal O1 with several signals generated in a similar way as for O1*. The outputs of each double-rail checker will be driven by a strongly fail-safe error indicator. These indicators will be connected in series to cut the power Vdd' when one or more double-rail checkers indicate an error.

Figure 17:
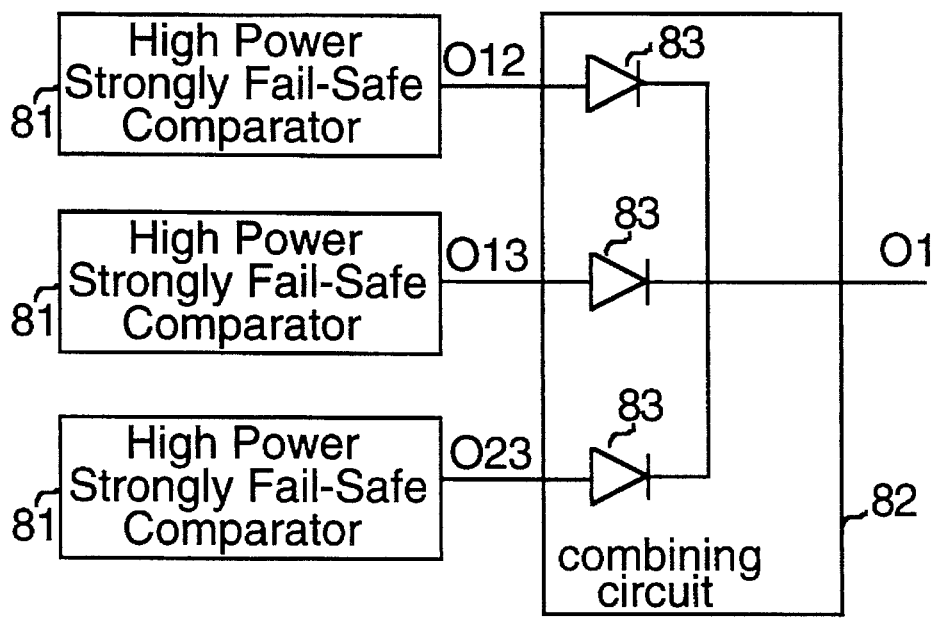
FIG. 17 illustrates high power strongly fail-safe voters.

High power strongly fail-safe voters can be implemented by using three high power strongly fail-safe comparators 81 and a combining circuit 82 as illustrated in FIG. 17. To obtain a fault tolerant voter each error indication will be used to cut the power of the corresponding comparator, similarly to the technique of FIG. 14.

The combining circuit of the voter must has the following properties:

a—no node of this circuit is connectable to the high power source excepting the inputs coming from the three comparators.

b—If a high power input is applied on this block by some comparator, it is transferred to its output.

c—The block isolates its inputs from each other (to avoid high power dissipation when one input is connected to the ground and the other brings the high power state.

A recombination block that meets points a—, b— and c— is shown in FIG. 17. This block uses three diodes 83 driven by the outputs of the comparators. The outputs of the diodes are connected together to give the output O1 of the voter. We note that a simple way to meet points a— and b— is to bridge the lines O12, O13, and O14. However, this solution does not meet point c—.

I claim:

1. Fail-safe circuit branch for providing a signal having a safe state or a non-safe state, comprising:
   inputs for receiving at least two binary control signals (Si, Si*);
   a source of a non-safe state (Fe) connectable through a basic chain (14, 15) to an output (Oi) when the control signals realize a predetermined combination;
   a concurrent checker (17) providing an error detection signal (g1, g2) if the inputs of a pair of its inputs are at predetermined states; and
   means (14, 14*) for providing a first input of said pair of inputs with a signal corresponding to the state of said output and the second input of said pair of inputs with a signal corresponding to the output of a duplicate chain of the basic chain, this duplicate chain reacting like the basic chain in response to the control signals.

2. A fail-safe circuit comprising:
   a plurality of fail-safe branches according to claim 1, all sharing a common concurrent checker; and
   a non-fail-safe combining circuit receiving the outputs of the branches, this combining circuit being such that it lacks a source of the non-safe state and that it provides a non-safe state output if one or more branches provide the non-safe state.

3. A fail-safe logic circuit according to claim 2, wherein the combining circuit realizes an OR function, comprising:
   a plurality of logic inputs corresponding to the binary control signals of the branches; and
   for each combination of the logic inputs that should generate an non-safe state of the logic circuit, a branch that transfers the non-safe state to the combining circuit when the logic inputs realize this combination.

4. A two-input exclusive OR circuit according to claim 3, comprising two branches, one transferring the non-safe state for the combination 1, 0 of the inputs, and the other for the combination 0, 1.

5. A fail-safe control interface according to claim 1, comprising, in the basic chain, at least one switch (14) controlled by one of the binary control signals (Si) and means for irreversibly cutting the power of the interface if the concurrent checker provides an error detection signal.

6. A fail-safe control interface according to claim 5, wherein the concurrent checker is a double-rail checker (17) having two outputs (g1, g2) providing the error detection signal (Oe) through an exclusive OR circuit (37) the branches of the exclusive OR circuit and the branch of the interface sharing the double-rail checker.

7. A fail-safe control interface according to claim 6, comprising, between the exclusive OR circuit (37) and the double-rail checker (17), an error indicator lock circuit (36).

8. A fail-safe control interface according to claim 7, comprising two exclusive OR circuits (37, 38) both provided with the outputs of the error indicator lock (36) and sharing the double-rail checker, the branches of a first of the exclusive OR circuits being connected to the non-safe state (Fe), and the branches of the second being connected to the output of the first.

9. A fail-safe control interface according to claim 2 realising a majority voter, comprising:
   three branches each receiving a different pair of control signals ($S^1, S^2, S^3$); and
   a non-fail-safe combining block that transfers the non-safe state to its output whenever this state is present at the output of at least one branch.

\* \* \* \* \*